United States Patent
He et al.

(10) Patent No.: US 9,607,895 B2
(45) Date of Patent: Mar. 28, 2017

(54) SILICON VIA WITH AMORPHOUS SILICON LAYER AND FABRICATION METHOD THEREOF

(71) Applicant: Semiconductor Manufacturing International (Shanghai) Corporation, Shanghai (CN)

(72) Inventors: Zuopeng He, Shanghai (CN); Hongbo Zhao, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/722,153

(22) Filed: May 27, 2015

(65) Prior Publication Data

US 2016/0013135 A1 Jan. 14, 2016

(30) Foreign Application Priority Data

Jul. 14, 2014 (CN) .......................... 2014 1 0334110

(51) Int. Cl.
| | | |
|---|---|---|
| *H01L 21/30* | (2006.01) | |
| *H01L 29/04* | (2006.01) | |
| *H01L 21/768* | (2006.01) | |
| *H01L 23/48* | (2006.01) | |

(Continued)

(52) U.S. Cl.
CPC .. *H01L 21/76898* (2013.01); *H01L 21/76802* (2013.01); *H01L 21/76831* (2013.01); *H01L 21/76873* (2013.01); *H01L 23/481* (2013.01); *H01L 21/0243* (2013.01); *H01L 21/0262* (2013.01); *H01L 21/02488* (2013.01); *H01L 21/02532* (2013.01); *H01L 21/30625* (2013.01); *H01L 21/76843* (2013.01); *H01L 2924/0002* (2013.01)

(58) Field of Classification Search
CPC ......... H01L 21/76879; H01L 21/76819; H01L 21/02592; H01L 21/28556; H01L 21/30625; H01L 21/76898; H01L 23/481; H01L 21/76831; H01L 21/76873; H01L 21/02532; H01L 21/76802
See application file for complete search history.

(56) References Cited

U.S. PATENT DOCUMENTS

| | | | | |
|---|---|---|---|---|
| 5,627,098 | A * | 5/1997 | Iranmanesh | ........ H01L 23/5252 257/E23.147 |
| 6,235,625 | B1 * | 5/2001 | Lou | ................... H01L 21/76843 257/E21.586 |

(Continued)

*Primary Examiner* — Alonzo Chambliss
(74) *Attorney, Agent, or Firm* — Anova Law Group, PLLC

(57) ABSTRACT

A method is provided for fabricating a semiconductor structure. The method includes providing a substrate having an upper surface and a bottom surface; and forming a deep hole in the substrate from the upper surface. The method also includes forming an amorphous silicon layer on a side surface and a bottom surface of the deep hole to promote a preferred crystal orientation in subsequently formed layers. Further, the method includes forming a barrier layer having a preferred orientation along the (111) crystal face on the barrier layer. Further, the method also includes forming a metal layer having a preferred orientation along the (111) crystal face on the barrier layer to fill the through hole.

19 Claims, 6 Drawing Sheets

(51) Int. Cl.
*H01L 21/02* (2006.01)
*H01L 21/306* (2006.01)

(56) References Cited

U.S. PATENT DOCUMENTS

| | | | |
|---|---|---|---|
| 6,372,636 B1* | 4/2002 | Chooi | H01L 21/76807 257/E21.579 |
| 6,436,840 B1* | 8/2002 | Besser | H01L 21/28044 257/E21.198 |
| 2002/0068399 A1* | 6/2002 | Divakaruni | H01L 27/10867 438/243 |
| 2009/0209096 A1* | 8/2009 | Lee | H01L 21/28518 438/586 |
| 2011/0057317 A1* | 3/2011 | Koike | H01L 21/28518 257/751 |
| 2013/0270712 A1* | 10/2013 | Chen | H01L 21/76898 257/774 |

\* cited by examiner

SILICON VIA WITH AMORPHOUS SILICON LAYER AND FABRICATION METHOD THEREOF

CROSS-REFERENCES TO RELATED APPLICATIONS

This application claims the priority of Chinese patent application No. 201410334110.1, filed on Jul. 14, 2014, the entirety of which is incorporated herein by reference.

FIELD OF THE INVENTION

The present invention generally relates to the field of semiconductor manufacturing technology and, more particularly, relates to semiconductor structures and fabrication processes thereof.

BACKGROUND

With the rapid development of the semiconductor fabrication technology, the semiconductor chips are being developed into a higher integration level to obtain higher computing speed, higher data storage capacity, and more functionalities. With continuously increasing the integration level of the semiconductor chips, the feature size of the semiconductor devices has become smaller and smaller.

Three-dimensional integrated circuits (ICs) are formed using the advanced chip stacking technique to stack chips with different functions into ICs into three-dimensional structures. Comparing with two-dimensional ICs, the stacking technique of the three-dimensional ICs may not only shorten the signal transfer paths, but also speed up the three-dimensional ICs. Thus, the stacking technique of the three-dimensional ICs may match the requirements of the semiconductor devices for higher performance, smaller feature size, lower power consumption and more functions, etc.

Through Silicon Via (TSV) technique is a new generation interconnect technique to achieve the three-dimensional ICs; and is one of the key techniques of semiconductor manufacturing. The TSV technique is able to further shorten the signal transfer paths in the three-dimensional ICs, thus the speed of the three-dimensional ICs may be faster; and the number of the stacking chips may not be limited.

Comparing with the conventional stacking methods in the IC packaging and bonding process, the TSV technique is able to obtain a significantly large stacking density in three dimensions, and the size of the packaging structure formed by the TSV technique is substantially small. Thus, the speed of the chips is significantly improved; and the power consumption is reduced. Therefore, the TSV technique is a referred as a three-dimensional TSV technique. The major advantages of the TSV includes having the minimum size and weight, integrating various techniques into a single packaging structure; substituting the relatively long two-dimensional interconnect with a relative short perpendicular interconnect; and lowering the parasitic effect and the power consumption, etc.

However, the electrical properties the semiconductor structures formed by existing TSV techniques need further improvements. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate having an upper surface and a bottom surface; and forming a deep hole in the substrate from the upper surface. The method also includes forming an amorphous silicon layer on a side surface and a bottom surface of the deep hole to promote a preferred crystal orientation in subsequently formed layers. Further, the method includes forming a barrier layer having a preferred orientation along a (111) crystal face on the amorphous silicon layer. Further, the method also includes forming a metal layer having a preferred orientation along the (111) crystal face on the barrier layer to fill the through hole.

Another aspect of the present disclosure includes a semiconductor structure. The semiconductor structure includes a substrate; and a through hole formed in the substrate. The method also includes an amorphous silicon layer formed on a side surface of the through hole to promote a preferred crystal orientation in subsequently formed layers. Further, the method includes a barrier layer having a preferred orientation along a (111) crystal face formed on the side surface of the amorphous silicon layer. Further, the method also includes a metal layer having a preferred orientation along a (111) crystal face formed on the barrier layer to fill the through hole.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
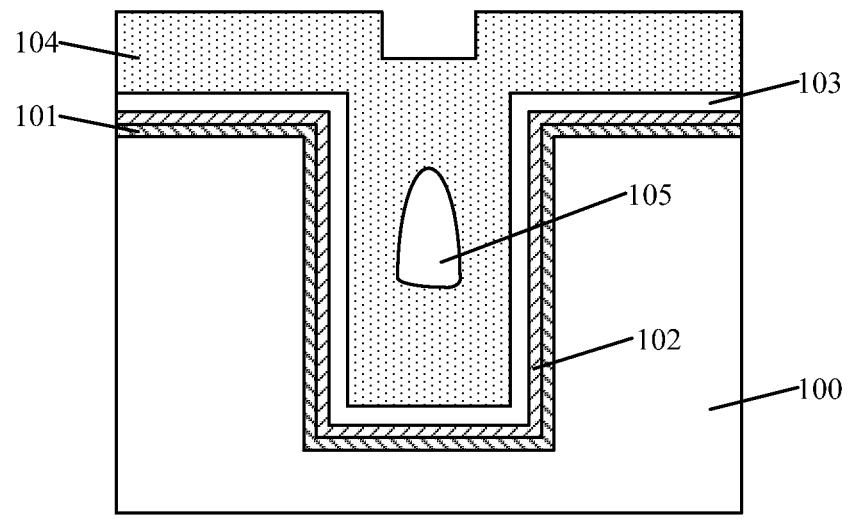
FIG. 1 illustrates an existing fabrication process of a semiconductor structure.

FIG. 1 illustrates an existing fabrication process of a semiconductor structure. The process includes providing a substrate 100 having a deep hole (not labeled), i.e., a portion of a subsequently formed through hole; and forming an oxide layer 101 on the side surface and the bottom surface of the deep hole and the top surface of the substrate 100. The process also includes forming a barrier layer 102 on the surface of the oxide layer 101; and forming a seed layer 103 on the surface of the barrier layer 102. Further, the method includes forming a metal layer 104 on the seed layer 103 to fill the deep hole.

The metal layer 104 is usually made of Cu because Cu has a lower resistivity, higher melting point, and lower thermal expansion coefficient than Al. However, the electrical properties of the semiconductor structure having the metal layer 104 made of Cu may need further improvements. For example, the RC delay effect and the electromigration issue of the metal layer 104 made of Cu may be severe.

Figure 1A:
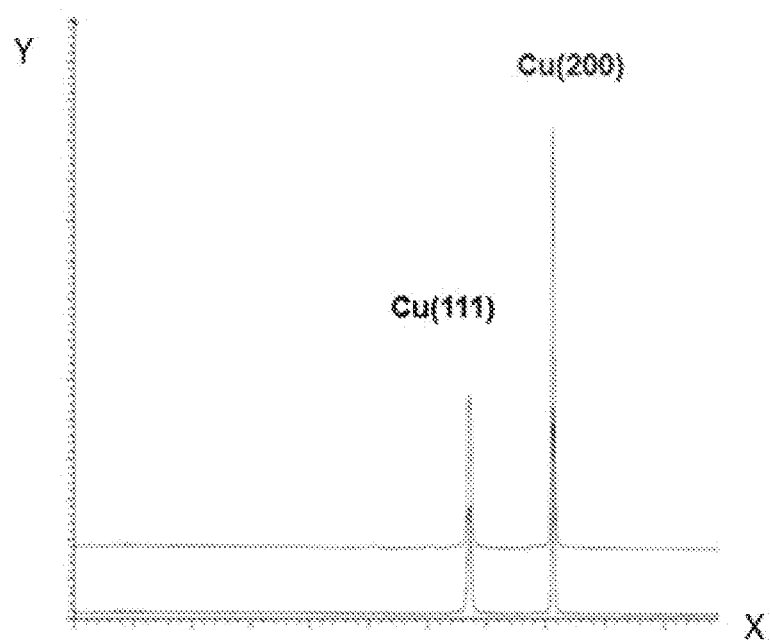
FIG. 1a illustrates X-ray diffraction patterns of the metal layer of the semiconductor structure formed by the process illustrated in FIG. 1.

An X-ray diffraction (XRD) analysis may be performed on the semiconductor structure formed by the method illustrated in FIG. 1 to measure the crystal orientations of the seed layer 103 and the metal layer 104. The corresponding XRD patterns is illustrated in FIG. 1a. The X-axis of the XRD patterns refers to the two times of the incident angle (2 Theta). The Y-axis of the XRD patterns refers to the relative intensity. Two different positions of the seed layer 103 and the metal layer 104 are measured by XRD.

Figure 12:
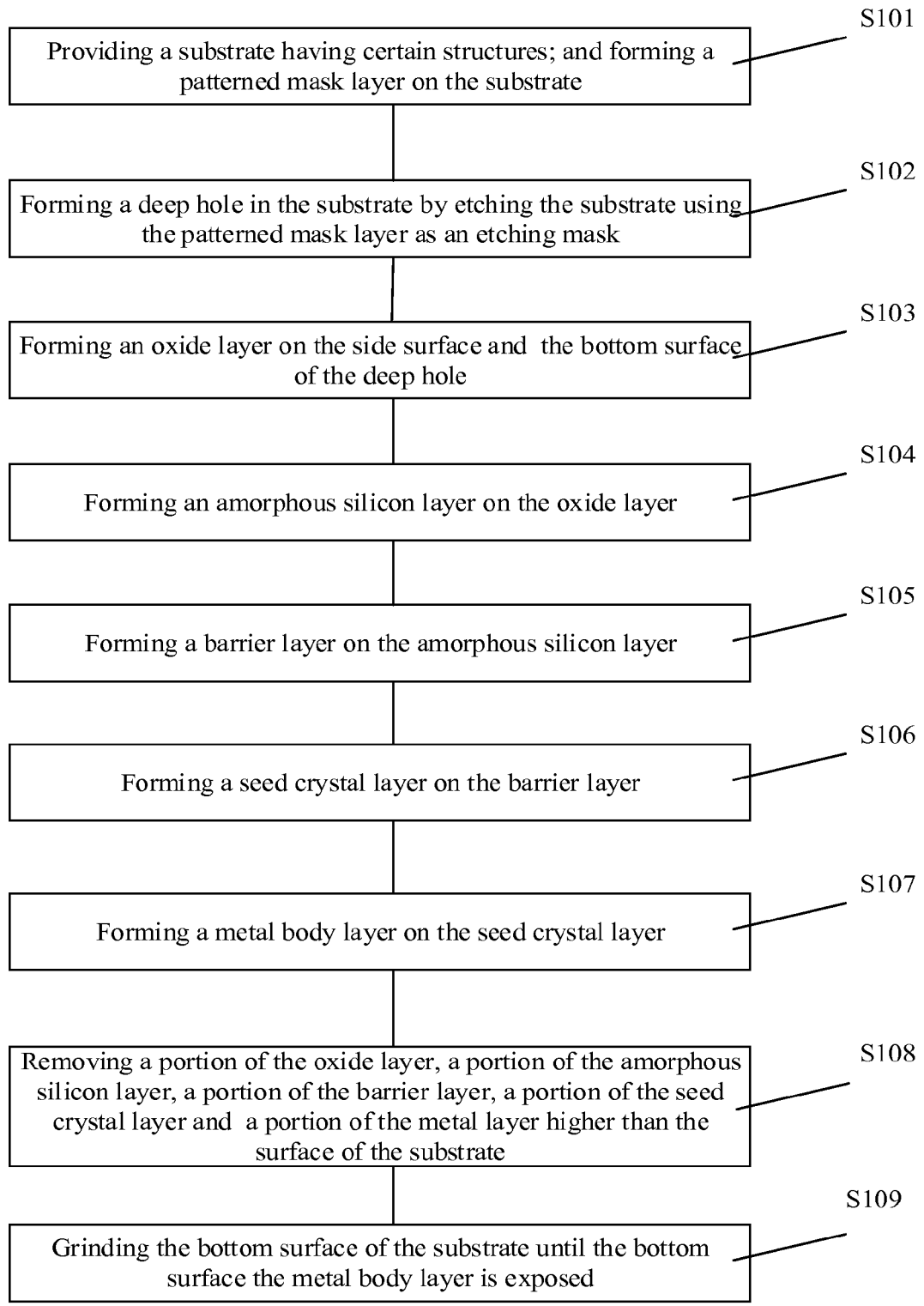
FIG. 12 illustrates an exemplary fabrication process of a semiconductor structure consistent with the disclosed embodiments.

As shown in FIG. 12, diffraction peaks of the seed layer 103 and the metal layer 104 may be found on both the (111) crystal face and the (200) crystal face. The two lines (top and bottom) of the XRD patterns are corresponding to the XRD patterns of the two positions. Further, the peak intensity of the (200) crystal face may be much greater than the peak intensity of the (111) crystal face. Thus, the majority of the crystal faces of the seed layer 103 and the metal layer 104 may not be the (111) crystal face. That is, the number of the (200) crystal faces may be greater than the number of the (111) crystal faces. Such a crystal orientation distribution may be one of the reasons for the undesired electrical properties of the semiconductor structure.

According to the crystallographic principle, the atomic density of the (111) crystal face of Cu is greater than the atomic density of other crystal faces. Thus, the atomic structural compactness of the (111) crystal face is greater than the atomic structural compactness of the (200) crystal face; and the anti-electromigration ability of the (111) crystal face may be much greater than the anti-electromigration ability of the (200) crystal face.

For example, the anti-electromigration ability of Cu on the (111) crystal face is approximately 4 times of the anti-electromigration ability of Cu on the (200) crystal face. Further, the resistivity of the Cu crystal grains formed on the (111) crystal face is smaller than the resistivity of the Cu crystal grains formed on the (200). If the majority of the crystal faces of the seed layer 103 and the metal layer 104 are the (111) crystal face, i.e., the preferred orientation of the seed layer 103 and the metal layer 104 is along the (111) crystal face, the quality of the seed layer 103 and the metal layer 104 may be improved. Thus, the resistivity of the seed layer 103 and the metal layer 104 may be reduced, the RC delay effect of the semiconductor structure may be improved; and the anti-electromigration ability of the semiconductor structure may be improved.

Therefore, according to the above analysis, the RC delay effect and the electromigration issue of the metal layer 104 made of Cu may be caused by dominated (200) crystal face orientation of the metal layer 104. That is, the metal layer 104 has a preferred orientation along the (200) crystal face. As used herein, the preferred orientation may refer to a certain direction with which the crystal orientations of the Cu crystal grains are distributed along. That is, the crystal grains of Cu may not randomly oriented. In a polycrystalline material, each crystal grain may have its own crystal direction (or crystal face) different from the crystal directions of the adjacent crystal grains. Overall, the crystal orientation of all crystal grains may be random. Under certain circumstances, the crystal orientations of the crystal grains may not be distributed uniformly, but relatively distributed along the certain direction. The certain direction may be referred as the preferred orientation.

Further, according to the XRD patterns illustrate in FIG. 1a, because the seed layer 103 has random orientations, and the number of the (200) crystal faces may be greater than the number of the (111) crystal faces, the wetting ability of an electroplating process for forming the metal layer 104 on the surface of the seed layer 103 may be unacceptable. Thus, referring to FIG. 1, a void 105 may be formed in the metal layer 104 formed on the surface of the seed layer 101. Such a void 105 may be another reason for the unacceptable electrical properties of the semiconductor structure.

There may be a plurality of reasons that it may be difficult to form (111) crystal face oriented seed layer 103 and metal layer 104. Firstly, the oxide layer 101 may be often made of silicon oxide. The surface of the oxide layer 101 may have relatively stable Si—O bonds; and the oxide layer 101 may be a polycrystalline structure. Thus, the surface chemistry of the oxide layer 101 may be relatively stable; and the oxide layer 101 may be unable to provide extra energy for forming the barrier layer 102. If the energy of the process for forming the barrier layer 102 on the oxide layer 101 is relatively low, the energy provided for forming the nuclei on the surface of the oxide layer 101 may also be relatively low. Further, the required energy for the nuclei to grow into the (200) crystal face is less than the required energy for the nuclei to grow into the (111) crystal face. Thus, the energy provided by the process for forming the barrier layer 102 may be unable to match the energy requirement for the nuclei to grow into the (111) crystal face. Therefore, the number of the (200) crystal faces in the barrier layer 102 may be greater than the number of the (111) crystal faces, and the crystal faces of the barrier layer 102 may be randomly distributed.

Further, comparing with a barrier layer with a preferred orientation, a barrier layer with random orientations may have substantially low anti-corrosion ability; and the resistivity may be significantly high. Further, because the crystal faces of the barrier layer 102 have random orientations, the crystal orientations of the seed layer 103 formed on the barrier layer 102 may be affected. For example, because the seed layer 103 is formed on the barrier layer 102, the crystal orientation of the seed layer 102 made of Cu along the (200) crystal face may be much stronger than on the crystal orientation along the (111) crystal face. Thus, the metal layer 104 made of Cu formed on the surface of the seed layer 103 may have a same crystal orientation as the seed layer 103. That is, the crystal orientation of the metal layer 104 made of Cu along the (200) crystal face may be much stronger than the crystal orientation along the (111) crystal face. Thus, it may be difficult to form a meal layer with a preferred orientation along the (111) crystal face although the (111) crystal face oriented metal layer made of Cu may provide desired electrical properties.

Further, the barrier layer 102 may be formed by a chemical vapor deposition (CVD) process. The reaction energy of a CVD process may be majorly obtained by heating a substrate with a heat source (for example, increasing the temperature of the reaction chamber). The reaction energy of a physical vapor deposition (PVD) process may be majorly provided by the particles of the plasma (electrons, ions, or neutral particles), an electron beam, or a laser beam, etc. Thus, comparing with the PVD process, the reaction energy provided by the CVD process may be much smaller than the reaction energy provided by the PVD process. Therefore, when a CVD process is used to form the barrier layer 102, the random orientations of crystal faces of the barrier layer 102 may be more severe. Accordingly, the random orientations of the crystal faces of the seed layer 103 and the metal layer 104 may be more severe as well. That is, it may be difficult to form (111) crystal face oriented seed layer 103 and metal layer 104. According to the disclosed methods and device structures, the random orientation issue of the crystal faces of the barrier layer and the metal layer and other issues may be overcome by forming an amorphous silicon layer on the oxide layer.

FIG. 12 illustrates an exemplary fabrication process of a semiconductor structure consistent with the disclosed embodiments; and FIGS. 2~10 illustrate semiconductor structures corresponding to certain stages of the exemplary fabrication process of a semiconductor structure.

Figure 2:
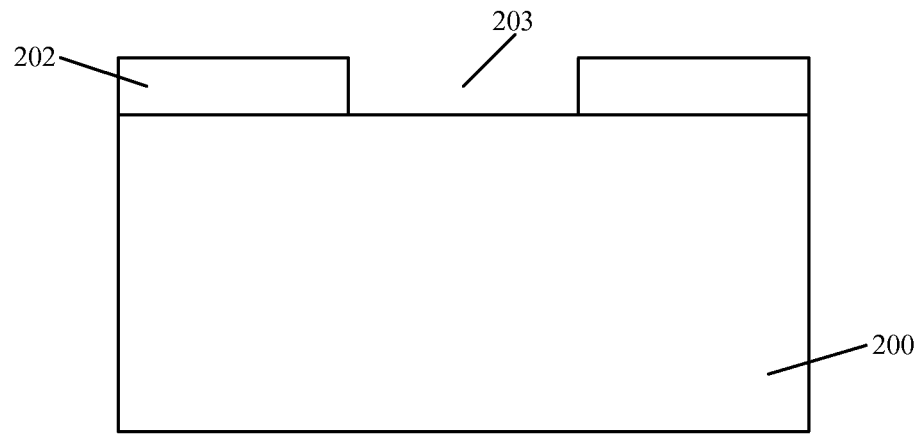
FIGS. 2~10 illustrate semiconductor structures corresponding to certain stages of an exemplary fabrication process of a semiconductor structure consistent with the disclosed embodiments.

As shown in FIG. 12, at the beginning of the fabrication process, a substrate with certain structures is provided (S101). FIG. 2 illustrates a corresponding semiconductor structure.

As shown in FIG. 2, a substrate 200 is provided; and a patterned mask layer 202 is formed on the surface of the substrate. The patterned mask layer 202 may have an opening 203 exposing the surface of the substrate 200.

The substrate 200 may include any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor or a combination thereof. In one embodiment, the substrate 200 is silicon; and the subsequently formed through hole in the substrate 200 may be a through silicon hole. The substrate 200 provides a base for subsequent processes and structures. Semiconductor devices, such as MOS transistors, fin field effect transistors, resistors, or capacitors, etc., may be formed in the substrate 200.

Further, referring to FIG. 2, the substrate 200 may have an upper surface and a bottom surface corresponding to upper surface. The surface of substrate 200 having the patterned mask layer 202 may be referred as the upper surface. The other surface of the substrate 200 may be referred as the bottom surface. The bottom of the substrate 200 may be subsequently grinded to form through holes in the substrate 200. Further, an interlayer dielectric layer (not shown) may be formed on the upper surface of the substrate 200.

The position and the size of the opening 203 may define the size and the position of the subsequently formed through hole. The patterned mask layer 202 may be a single layer structure, or a multiple-stacked structure. The patterned mask layer 202 may be made of any appropriate material, such as silicon oxide, silicon nitride, silicon oxynitride, or metal, etc. In one embodiment, the patterned mask layer 202 is a single layer structure made of silicon nitride.

A process for forming the patterned mask layer 202 may include sequentially forming an initial mask layer (not labeled) on the surface of the substrate 200; forming a patterned photoresist layer (not shown) on the surface of the initial mask layer; etching the initial mask layer using the patterned photoresist layer as an etching mask; and removing the patterned photoresist layer. Thus, the patterned mask layer 202 with the opening 203 may be formed on the surface of the substrate 200.

Various processes may be used to form the initial mask film, such as a thermal oxidation process, a chemical oxidation process, a chemical vapor deposition (CVD) process, a physical vapor deposition (PVD) process, or an atomic layer deposition (ALD) process, etc. The patterned photoresist layer may be removed by a wet etching process, or a plasma ashing process, etc.

Figure 3:
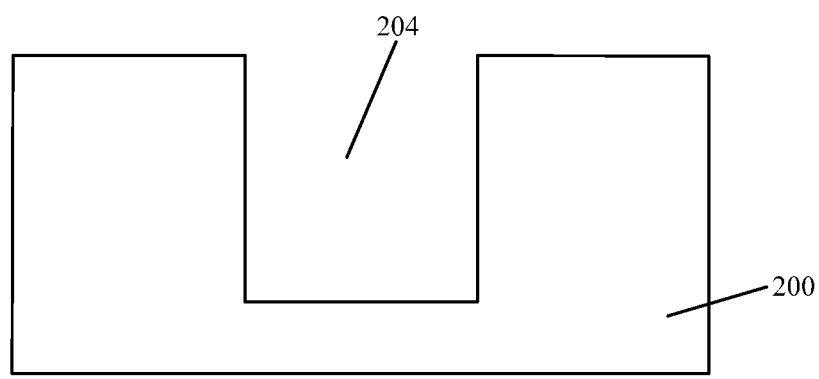

Returning to FIG. 12, after forming the patterned mask layer 202, a deep hole may be formed (S102). FIG. 3 illustrates a corresponding semiconductor structure.

As shown in FIG. 3, a deep hole 204 is formed in the substrate 200 by etching a portion of the substrate 200 using the patterned mask layer 202 as an etching mask. The deep hole 204 may be a portion a subsequently formed through hole. After subsequently grinding the substrate 200 from the bottom surface to expose the deep hole 204, the deep hole 204 may turn into a through hole in the grinded substrate 200. In certain other embodiments, if the deep hole exposes the surface of a device structure formed in the substrate 200, the deep hole 204 may be referred as a through hole.

After forming the deep hole 204, the patterned mask layer 202 may be removed. The deep hole 204 may penetrate through a portion of the substrate 200 and expose the semiconductor devices formed in the substrate 200; and a metal via may be subsequently formed in the deep hole 204 to electrical connect with the semiconductor devices. Thus, such a structure may be referred as a through silicon via (TSV).

The deep hole 204 may be formed by any appropriate process. In one embodiment, the deep hole 204 is formed by alternatively performing an etching process and a polymer deposition process.

The polymer deposition process may be used to form a polymer layer (passivation layer, not shown) on the side surface of the deep hole 204 such that the etching rate of the etching process along the vertical direction may be significantly greater than the etching rate of the etching process to the side surface of the deep hole 204. Thus, the side surface of the deep hole 204 may be protected by the polymer layer from being damaged by the etching process; and the surface roughness of the deep hole 204 may be improved.

The etching process may be any appropriate type of etching process, such as a dry etching process, a wet etching process, or an ion beam etching process, etc. In one embodiment, the etching process is a reactive etching process. The etching gas of the reactive etching process may be one or more of $S_6F_8$, $NF_3$, or $SF_6$, etc. The etching gas of the reactive etching process may also include $O_2$, etc. The total flow rate of $S_6F_8$, $NF_3$, or $SF_6$ may be in a range of approximately 200 sccm~500 sccm. The flow rate of $O_2$ may be in a range of approximately 100 sccm~200 sccm. The pressure of the reaction chamber of the reactive etching process may be in a range of approximately 200 mTorr~600 mTorr. The power of the radio frequency power source of the reactive etching process may be in a range of approximately 1000 W~2500 W.

The reaction gas for forming the polymer layer may include $C_4H_8$, and $O_2$, etc. The flow rate of $C_4H_8$ may be in a range of approximately 300 sccm~600 sccm. The flow rate of $O_2$ may be in a range of approximately 100 sccm~200 sccm. The pressure of the reaction chamber may be in range of approximately 300 mTorr~450 mTorr.

In one embodiment, the time of the etching process may be in a range of approximately 5 s~15 s. The time of the etching process may be greater than approximately 5 times of the time of the deposition process. Such an etching time and deposition time combination may shorten the time for forming the deep hole 204; and may reduce the manufacturing time of the semiconductor structure.

The etching process and the polymer deposition process may be alternatively performed until the depth of the deep hole 204 reaches a predetermined value. In one embodiment, the substrate 200 is made of silicon, the subsequent formed through hole based on the deep hole 204 may be referred as a through silicon hole.

The patterned mask layer 202 may be removed by any appropriate process, such as a dry etching process, or a wet etching process, etc. In one embodiment, the patterned mask layer 202 is removed by a wet etching process. The etching solution of the wet etching process may be a hot phosphoric acid solution. The temperature of the hot phosphoric acid solution may be in a range of approximately 120° C.~200° C. The mass percentile of phosphoric acid may be in a range of approximately 70%~85%.

Figure 4:
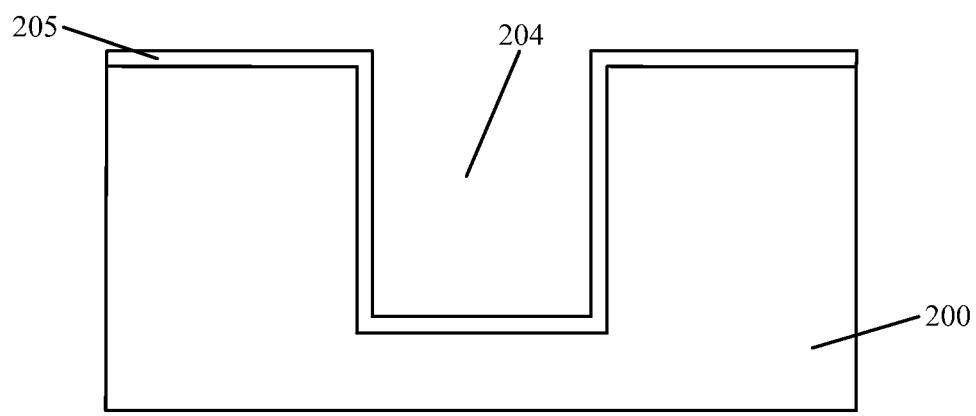

Returning to FIG. 12, after forming the deep hole 204, an oxide layer may be formed (S103). FIG. 4 illustrates a corresponding semiconductor structure.

As shown in FIG. 4, an oxide layer 205 is formed on the bottom surface and the side surface of the deep hole 204. The oxide layer 205 may also be formed on the surface of the substrate 200, simultaneously.

After forming the deep hole 204 by the etching process, the side surface and the bottom surface of the deep hole 204 may be damaged by the etching process. Thus, the interface properties of the deep hole 204 may be undesired. If an amorphous silicon layer is subsequently formed on the side surface and the bottom surface of the deep hole 204 directly, the adhesion force between the amorphous silicon layer and the side surface and the bottom surface of the deep hole 204 may be substantially weak. Thus, the quality of the semiconductor structure may be significantly affected.

Thus, the oxide layer 205 may be formed on the side surface and the bottom surface of the deep hole 204 before forming the amorphous silicon layer, an acceptable interface may be provided for subsequently forming the amorphous silicon layer. Further, the adhesion between the amorphous silicon layer and the side surface and the bottom surface of the deep hole 204 may be improved.

The oxide layer 205 may be made of any appropriate material. In one embodiment, the oxide layer 205 is made of silicon oxide. The thickness of the oxide layer 205 may be in a range of approximately 10 Å~20 Å.

Various processes may be used to form the oxide layer 205, such as a CVD process, a PVD process, or a thermal oxidation process, etc. In one embodiment, the oxide layer 205 is formed by a thermal oxidation process using a tube furnace. The reaction gas of the thermal oxidation process may include $O_2$, etc. The flow rate of $O_2$ may be in a range of approximately 20 sccm~200 sccm. The temperature of the thermal oxidation process may be in a range of approximately 600° C.~850° C.

Figure 5:
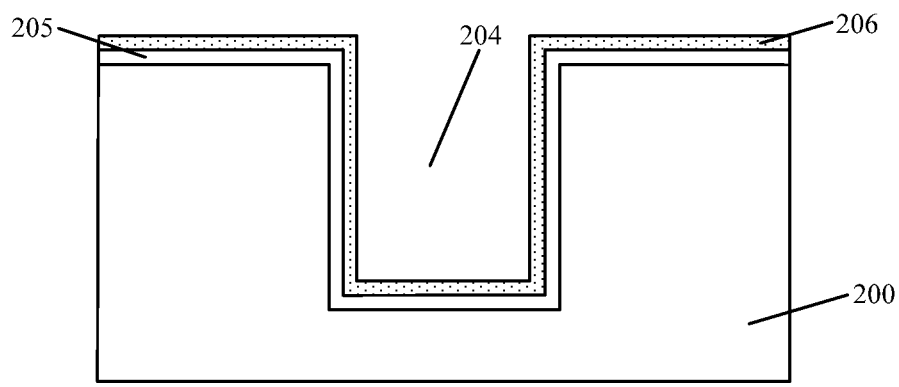

Returning to FIG. 12, after forming the oxide layer 205, an amorphous silicon layer may be formed (S104). FIG. 5 illustrates a corresponding semiconductor structure.

As shown in FIG. 5, an amorphous layer 206 is formed on the surface of the oxide layer 205. The amorphous silicon layer 206 is made of amorphous silicon. The distribution of the atoms of the amorphous silicon layer 206 may have a short range order. Thus, and a large amount of defects may be formed in the amorphous silicon layer 206. The defects may be a large amount of suspending bonds (unsaturated bonds), and voids, etc. Because the oxide layer 205 may be made of silicon oxide, the major chemical bond structures of the oxide layer 205 may be Si—O bonds. Further, the Si—O bonds may have a relatively high bond disassociation energy. Thus, the Si—O bonds may have a superior high temperature stability. Therefore, the surface of the amorphous silicon layer 206 may have more numbers of suspending bonds than the oxide layer 205.

Because the surface of the amorphous silicon layer 206 may have a significantly large amount of suspending bonds, the chemical activity of the surface of the amorphous silicon layer 206 may be significantly high. When a barrier layer is subsequently formed on the surface of the amorphous silicon layer 206, the barrier layer may have a preferred orientation along the (111) crystal face. Therefore, a metal layer subsequently formed on the barrier layer may also have a preferred orientation along the (111) crystal face; and the electrical properties of the semiconductor structure may be improved.

If the barrier layer is formed on the oxide layer 205 directly without forming the amorphous silicon layer 206, because the chemical activity of the surface of the oxide layer 205 may be relatively low, the crystal faces of the barrier layer formed on the oxide layer 205 may have random crystal face orientations. Thus, the electrical properties of the semiconductor structure may be affected.

The amorphous silicon layer 206 may be formed by any appropriate process, such as a PVD process, a CVD process, an ALD process, or a flowable CVD (FCVD) process, etc. In one embodiment, a CVD process is used to form the amorphous silicon layer 206. The reaction gas of the CVD process may include a silicon source gas, etc. The silicon source gas may be $SiH_4$, etc. The flow rate of the silicon source gas may be in a range of approximately 20 sccm~50 sccm. The pressure of the reaction chamber of the CVD process may be in a range of approximately 20 Torr~50 Torr. The temperature of the reaction chamber may be in a range of approximately 400° C.~500° C.

Because the amorphous silicon layer 206 is made of a non-conductive material, if the amorphous silicon layer 206 is significantly thick, the resistance of the semiconductor structure may be larger. Further, if the amorphous silicon layer 206 is substantially thin, because the deep hole 204 may have a relatively large height-to-width aspect ratio. Thus, the amorphous silicon layer 206 may be unable to completely cover the oxide layer 205. Therefore, in one embodiment, the thickness of the amorphous silicon layer 206 may be in a range of approximately 100 Å~500 Å.

In certain other embodiments, the oxide layer 205 is omitted, an amorphous silicon layer 206 may be directly formed on the side surface and the bottom surface of the deep hole 204. The amorphous silicon layer 206 may also be formed on the surface of the substrate 200, simultaneously.

Figure 6:
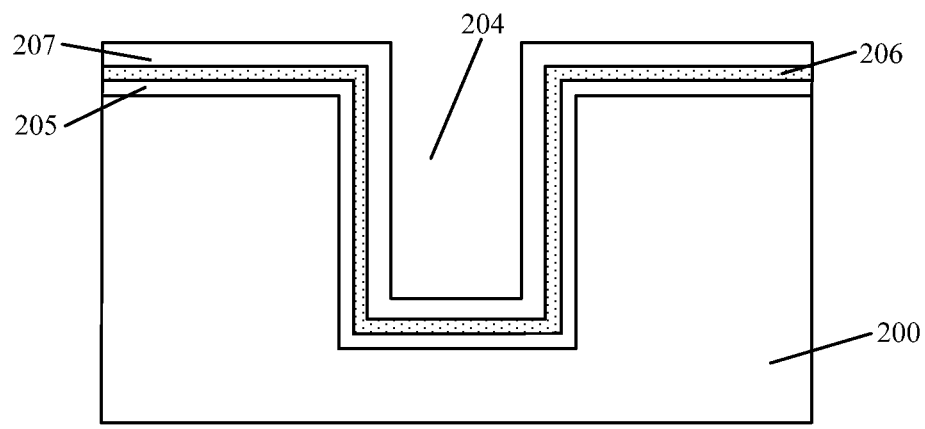

Returning to FIG. 12, after forming the amorphous silicon layer 206, a barrier layer may be formed (S105). FIG. 6 illustrates a corresponding semiconductor structure.

As shown in FIG. 6, a barrier layer 207 is formed on the surface of the amorphous silicon layer 206. The barrier layer 207 may have a preferred orientation along the (111) crystal face. The barrier layer 207 may be used to prevent the subsequent formed metal layer from diffusing into the substrate 200.

The subsequently formed metal layer may be made of Cu. Cu is a heavy metal material. Thus, Cu may rapidly diffuse into Si, and/or $SiO_2$ under a high temperature, and/or an electric field. Therefore, the barrier layer 207 may be formed between the substrate 200 and the metal layer before forming the metal layer to prevent Cu from diffusing into the substrate 200. Further, the barrier layer 207 may also be able to increase the adhesion between the substrate 200 and the metal layer.

The barrier layer 207 may be made of any appropriate material, such as Ta, TaN, or TiN, etc. With continuously decreasing the feature size of the semiconductor structures, the height-to-width ratio of the deep hole 204 has become larger and the larger, it may require the barrier layer 207 to have a desired step coverage. That is, the barrier layer 207 may be uniformly formed on the side surface and the bottom surface of the deep hole 204. Thus, the quality of the barrier layer 207 may match the design requirements. In order to obtain a significantly high step coverage; and lower the production cost, in one embodiment, the barrier layer 207 is made of TiN.

Various processes may be used to form the barrier layer 207, such as a CVD process, a PVD process, an ALD process, or an FCVD process, etc. Comparing with a PVD process, a CVD process may have a significantly high step coverage. Thus, the barrier layer 207 with a desired quality may be formed on both the side surface and the bottom surface of the deep hole 204; and the ability of the barrier layer 207 for preventing the Cu diffusion into the substrate 200 may be improved. Further, the cost of the CVD process may be relatively low. Thus, the production cost of the semiconductor structure may be reduced. Therefore, in one embodiment, a CVD process is used to form the barrier layer 207.

In one embodiment, the barrier layer 207 is made of TiN, the source gas of the CVD process for forming the barrier layer 207 may include a titanium source gas, a nitrogen source gas and $H_2$, etc. The titanium source gas may be $TiCl_4$, etc. The nitrogen source gas may be $N_2$, etc. The flow rate of the titanium source gas may be in a range of approximately 20 sccm~200 sccm. The flow rate of the nitrogen source gas may be in a range of approximately 20 sccm~200 sccm. The flow rate of $H_2$ may be in a range of approximately 10 sccm~100 sccm. The pressure of the reaction chamber of the CVD process may be in a range of approximately 1 Torr~20 Torr. The temperature of the reaction chamber may be in a range of approximately 750° C.~1000° C. The thickness of the barrier layer 207 may be in a range of approximately 100 Å~1000 Å.

The amorphous silicon layer 206 may have a significantly large quantity of unstable Si—Si bonds, under the effects of external environments, the unstable Si—Si bonds may break into suspending bonds. Thus, the surface the amorphous silicon layer 206 may have a significantly large quantity of the suspending bonds; and the chemical activity of the surface of the amorphous silicon layer 206 may be significantly high. The barrier layer 207 may be formed on the surface of the amorphous silicon layer 206.

When the nuclei of the barrier layer 207 start forming on the surface of the amorphous layer 206, the suspending bonds may bond with atoms in the nuclei of the barrier layer 207. Thus, a significantly high energy may be released. The released energy may further enter into the growth of the nuclei. Thus, in one embodiment, during the initial growth of the barrier layer 207 in the CVD process (the nucleation stage), the reaction energy provided by the external environments may include the energy provided by the high temperature and the energy released by the suspending bonds.

Therefore, the nucleation of the barrier layer 207 may have a relatively high reaction energy. The relatively high reaction energy may provide a fundamental energy for the nuclei to grow into crystal grains with a preferred orientation along the (111) crystal face. Thus, it may be easy for the nuclei to grow into the crystal grains with a preferred orientation along the (111) crystal face. Correspondingly, the barrier layer 207 having the crystal grains with a preferred orientation along the (111) crystal face may also have a preferred orientation along the (111) crystal face.

If a barrier layer is directly formed on the surface of the oxide layer 205, because the surface of the oxide layer 205 may have a large quantity of Si—O bonds. Thus, the chemical activity of the surface of the oxide layer 205 may be relatively low. During the nucleation of the barrier layer 207, the energy provided by the external environments may only include the high temperature. Further, the energy for the nuclei to grow into the (111) crystal face may be greater than the energy for the nuclei to grow into the (200) crystal face. Thus, the barrier layer 207 may have crystal faces with random orientations if the barrier layer is directly formed on the surface of the oxide layer 205. The quality of the barrier layer 207 having random crystal face orientations may not match the designed requirements. Further, the metal layer subsequently formed on the barrier layer 207 having the random crystal face orientations may also have random crystal face orientations. Thus, the electrical properties of the semiconductor structure may be affected.

In one embodiment, the barrier layer 207 may have a preferred orientation along the (111) crystal face. Thus, the anti-corrosion ability of the barrier layer 207 may be improved. Further, the resistivity of the barrier layer 207 may be reduced because of the preferred orientation along the (111) crystal face. Thus, the overall resistance of the semiconductor structure may be reduced, and the RC delay effect of the semiconductor structure may be reduced.

Figure 7:
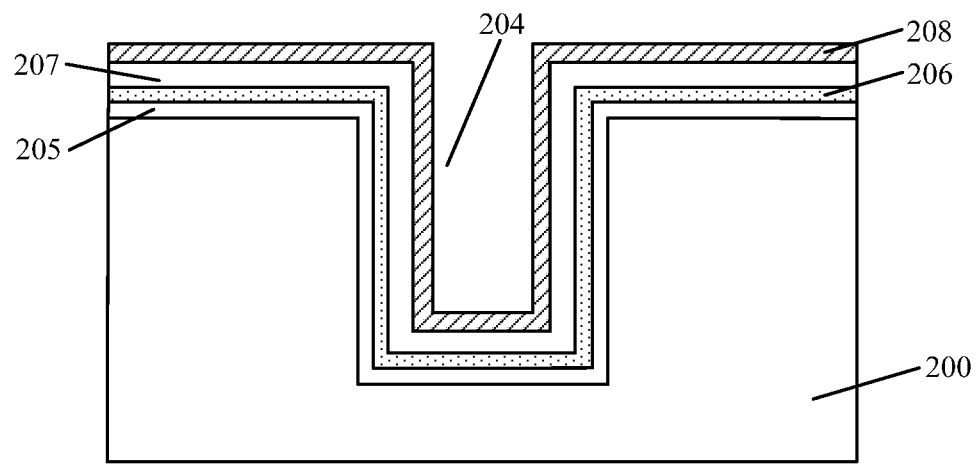

Returning to FIG. 12, after forming the barrier layer 207, a seed crystal layer may be formed (S106). FIG. 7 illustrates a corresponding structure.

As shown in FIG. 7, a seed crystal layer 208 is formed on the surface of the barrier layer 207. The seed crystal layer 208 may also have a preferred orientation along the (111) crystal face The seed crystal layer 208 may be used as a conductive layer (a cathode in an electroplating process) for subsequently forming a metal body layer using an electroplating process; and make a preparation for subsequently forming the metal body layer. Further, the seed crystal layer 208 may also provide a desired interface for subsequently forming the metal body layer. The seed crystal layer 208 may aid to subsequently form a metal body layer which has a significantly high adhesion with the seed crystal layer 208. Thus, the electromigration issue of the semiconductor structure may be improved.

In one embodiment, the barrier layer 207 may have a preferred orientation along the (111) crystal face. Thus, the seed crystal layer 208 formed on the surface of the barrier layer 207 may also have a preferred orientation along the (111) crystal face due to the effect of the surface properties of the barrier layer 207. Further, the seed crystal layer 208 may provide a base for subsequently forming a metal layer having a preferred orientation along the (111) crystal face. Further, the resistivity of the seed crystal layer 208 having the preferred orientation along the (111) crystal face may be lower than the resistivity of a seed crystal layer having random crystal face orientations.

The seed crystal layer 208 may be a single layer structure, or a multiple-layer structure consisting of layers with larger size crystal grains, and layers with smaller size crystal grains. If the seed crystal layer 208 is a multiple-layer structure, the layer with smaller size crystal grains may be under the layer with the larger size crystal grains. Such a structure may increase the adhesion between the seed crystal layer 208 and the barrier layer 207.

Various processes may be used to form the seed crystal layer 208, such as a CVD process, a PVD process, or an FCVD process, etc. In one embodiment, the seed crystal layer 208 is formed by a CVD process. The barrier layer 207 and the seed crystal layer 208 may be formed in a same CVD apparatus. The thickness of the seed crystal layer 208 may be in a range of approximately 10 Å~50 Å.

Figure 8:
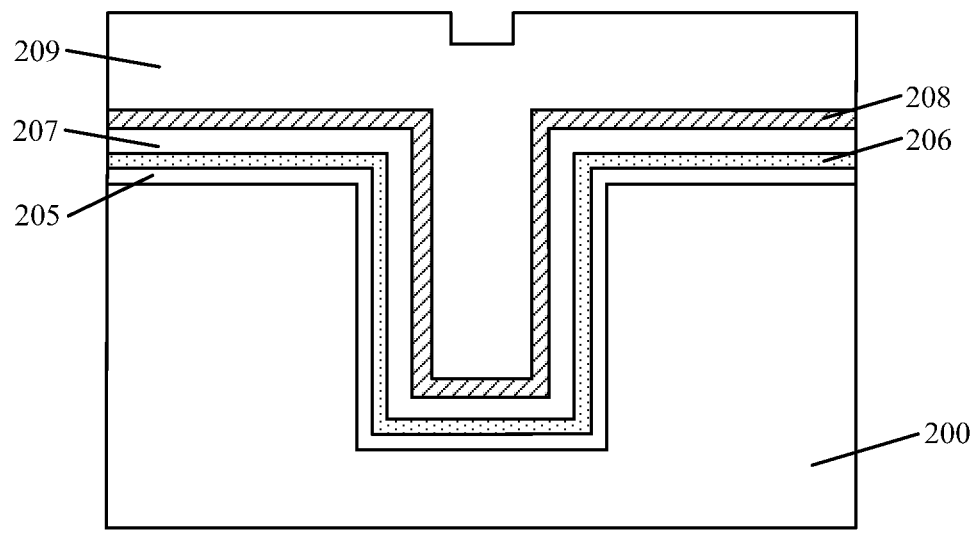

Returning to FIG. 12, after forming the seed crystal layer 208, a metal body layer may be formed (S107). FIG. 8 illustrates a corresponding semiconductor structure.

As shown in FIG. 8, a metal body layer 209 is formed on the surface of the seed crystal layer 208, and the metal body layer 209 may fill the deep hole 204. The metal body layer 209 may be made of any appropriate process, such as Cu, Ag, Au, or Al, etc. In one embodiment, the metal body layer 209 is made of Cu.

Various processes may be used to form the metal body layer 209, such as a PVD process, a CVD process, or an electroplating process, etc. In one embodiment, the metal body layer 209 is formed by an electroplating process. After forming the seed crystal layer 208, the substrate 200 may be transferred into an electroplating cell; and the metal body layer 209 may be formed by an electroplating process. During the electroplating process, the metal Cu may fill the deep hole 204. Further, a portion of the metal Cu may overly fill the deep hole 204, and may be formed on the surface of the seed crystal layer 208 above the top surface of the substrate 200 as a Cu block.

An electroplating solution may be filled in the electroplating cell; and a Cu anode and a cathode of a power source may be disposed in the electroplating cell. The electroplating solution may include $CuSO_4$, $H_2SO_4$, and $H_2O$, etc. The electroplating solution may also include catalysts, inhibitors, and adjustors, etc.

During the electroplating process, the seed crystal layer 208 may be connected with the negative electrode of the power source; and the Cu anode may be connected with the positive electrode of the power source. Then, an oxidation reaction may happen on the Cu anode; and the Cu atoms may be oxidized into $Cu^{2+}$ ions. At the same time, a reduction reaction may happen proximity to the surface of the seed crystal layer 208; and Cu atoms may be formed. The Cu atoms may be formed on the surface of the seed crystal layer 208. Thus, the metal body layer 209 may be formed on the surface of the seed crystal layer 208.

After the Cu atoms are deposited on the surface of the seed crystal layer 208, a nucleation of the Cu atoms may happen on the surface of the seed crystal layer 208, and Cu nuclei may be formed. The Cu nuclei may grow into Cu crystal grains; and the Cu crystal grains may form the metal body layer 209. Because the seed crystal layer 208 may have a preferred orientation along the (111) crystal face, the majority of the Cu nuclei may grow along the (111) crystal face. Therefore, the metal body layer 209 may also have a preferred orientation along the (111) crystal face.

The (111) crystal face of Cu may have a relatively large atomic density. Thus, the metal body layer 209 having the preferred orientation along the (111) crystal face may have a relatively low resistivity. Therefore, the electrical properties of the semiconductor device having the metal body layer may be improved; and the RC delay effect of the semiconductor structure may be reduced. Further, the anti-electromigration ability of Cu on the (111) crystal face may be approximately 4 times of the anti-electromigration ability of Cu on the (200) crystal face. Thus, the metal body layer 209 may have a significantly high anti-electromigration ability. Therefore, the electromigration issue and the RC delay effect of the semiconductor structure having the metal body layer with a preferred orientation along the (111) crystal face may be improved.

Further, the wettability of the Cu (111) crystal face may be greater than the wettability of the Cu (200) crystal face. Thus, when the electroplating process is performed on the surface of the seed crystal layer 208, the electroplating process may have a relatively high wettability on the surface of the seed crystal layer 208 having the preferred orientation along the (111) crystal face. Thus, the quality of the metal body layer 209 formed on the seed crystal layer 208 may be improved; and the density of the metal body layer 209 may be increased. Therefore, voids may be prevented from being formed in the metal body layer 209; and the electrical properties and the reliability of the semiconductor structure may be further improved.

In one embodiment, the seed crystal layer 208 formed on the side surface and the bottom surface of the deep hole 204 and the metal body layer 209 formed on the seed crystal layer 208 together may be referred as a metal layer. In certain other embodiments, the metal layer may only include the metal body layer 209.

Figure 9:
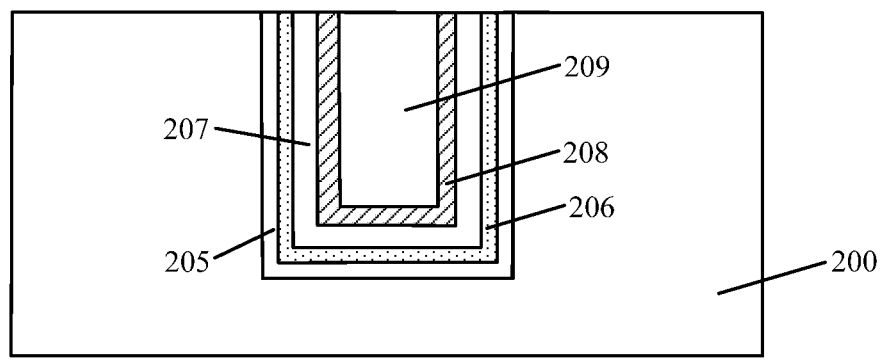

Returning to FIG. 12, after forming the metal body layer 209, a portion of the oxide layer 205, a portion of the amorphous silicon layer 206, a portion of the barrier layer 207, a portion of the seed crystal layer 208, and a portion of the metal body layer 209 may be removed (S108). FIG. 9 illustrates a corresponding semiconductor structure.

As shown in FIG. 9, a portion of the oxide layer 205, a portion of the amorphous silicon layer 206, a portion of the barrier layer 207, a portion of the seed crystal layer 208, and a portion of the metal body layer 209 higher than the surface of the substrate 200 are removed. Various processes may be used to remove the portion of the oxide layer 205, the portion of the amorphous silicon layer 206, the portion of the barrier layer 207, the portion of the seed crystal layer 208, and the portion of the metal body layer 209 higher than the surface of the substrate 200, such as a chemical mechanical polishing (CMP) process, or a physical mechanical polishing process, etc.

In one embodiment, a CMP process is used to remove the portion of the oxide layer 205, the portion of the amorphous silicon layer 206, the portion of the barrier layer 207, the portion of the seed crystal layer 208, and the portion of the metal body layer 209 higher than the surface of the substrate 200. After the CMP process, the top surface of the oxide layer 205, the top surface of the amorphous silicon layer 206; the top surface of the barrier layer 207, the top surface of the seed crystal layer 208, and the top surface of the metal body layer 209 may level with the upper surface of the substrate 200.

Figure 10:
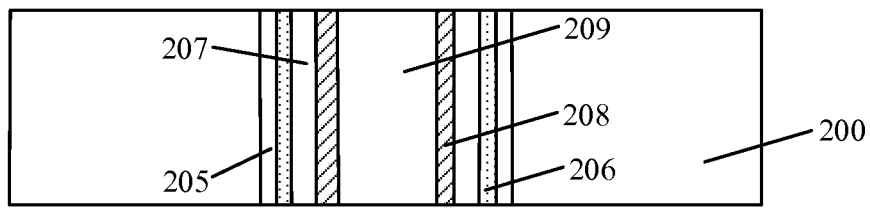

Returning to FIG. 12, after removing the portion of the oxide layer 205, the portion of the amorphous silicon layer 206, the portion of the barrier layer 207, the portion of the seed crystal layer 208, and the portion of the metal body layer 209 higher than the surface of the substrate 200, the substrate 200 may be grinded (S109). FIG. 10 illustrates a corresponding semiconductor structure.

As shown in FIG. 10, the substrate 200 is grinded from the bottom surface until the bottom surface of the metal body layer 209 is exposed. A process for grinding the substrate 200 until the bottom of the metal body layer 209 is exposed may include performing a first grinding process from the bottom surface of the substrate 200 until the bottom surface of the oxide layer 205 is exposed; performing a second grinding process until the bottom surface of the amorphous silicon layer 206 is exposed; performing a third grinding process until the bottom surface of the barrier layer 207 is exposed; performing a fourth grinding process until the bottom surface of the seed crystal layer 208 is exposed; and performing a fifth grinding process until the bottom surface of the metal body layer 209 is exposed. As used herein, the bottom surface may refer to the surface most near to the bottom surface of the deep hole 204 illustrated in FIG. 9.

After the grinding processes, the deep hole 204 may be turned into a through hole (not labeled); and the through silicon via is formed in the through hole.

The first grinding process, the second grinding process, the third grinding process, the fourth grinding process, and the fifth grinding process may be chemical mechanical polishing processes, or physical mechanical polishing processes, etc. By varying the polishing slurry of the first grinding process, the second grinding process, the third grinding process, the fourth grinding process, and the fifth grinding process, the polishing speeds may be effectively controlled; and the failure of the semiconductor structure caused by the over-polishing of the first grinding process, the second grinding process, the third grinding process, the fourth grinding process, and the fifth grinding process may be prevented.

Figure 11:
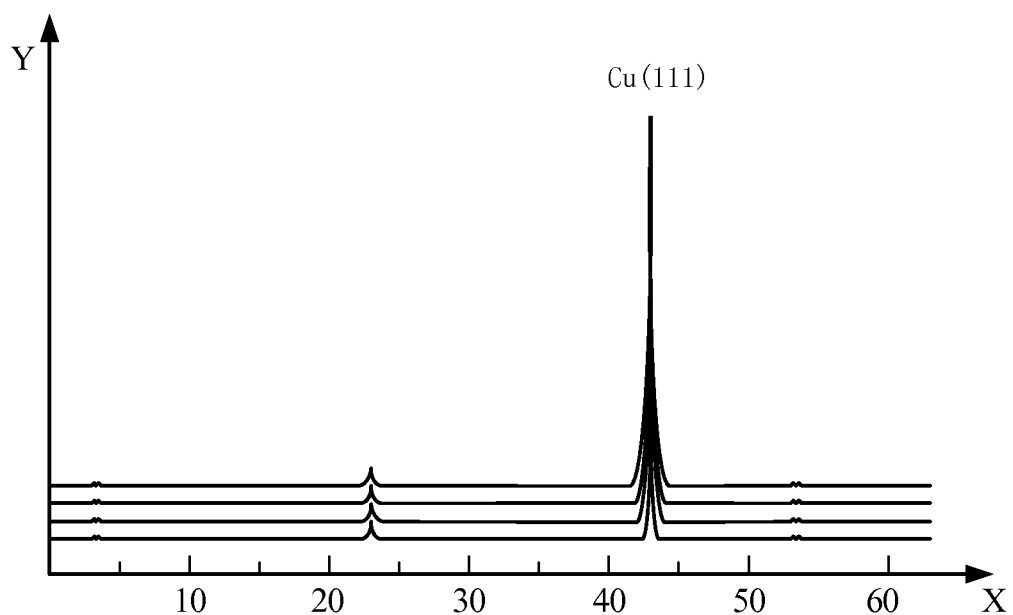
FIG. 11 illustrates X-ray diffraction patterns of the metal layer of a semiconductor structure consistent with the disclosed embodiments.

FIG. 11 illustrates X-ray diffraction (XRD) patterns of the metal layer including the seed crystal layer 208 and the metal body layer 209 of the semiconductor structure. The X-axis of the XRD patterns refers to the two times of the incident angle (2 Theta). The Y-axis of the XRD refers to the relative intensity. The XRD patterns of the metal layer measured at four different positions are illustrated in FIG. 11. Each of the four lines illustrated in FIG. 11 is corresponding the XRD patterns of one position. As shown in FIG. 11, the dominant peaks of the XRD patterns locate at the 2 theta of approximately 43°. The 2 theta of 43° corresponds to the (111) crystal face of Cu. Further, the XRD patterns for all of the four positions of the metal layer are approximately identical. Thus, the metal layer may have a preferred orientation along the (111) crystal face. As discussed above, the metal layer having the preferred orientation along the (111) crystal face may have desired electrical properties. Thus, the performance of the semiconductor structure having such a metal layer may be improved.

Thus, a semiconductor structure may be formed by the above disclosed processes and methods; and the corresponding semiconductor device is illustrated in FIG. 9. As shown in FIG. 9, the semiconductor structure includes a semiconductor substrate 200 having a deep hole (not labeled); and an oxide layer 205 formed on the side surface and the bottom surface of the deep hole. The semiconductor structure also includes an amorphous silicon layer 206 formed on the side surface of the oxide layer 205; and a barrier layer 207 having a preferred orientation along the (111) crystal face formed on the side surface of the amorphous silicon layer 206. Further, the semiconductor structure includes a seed crystal layer 208 having a preferred orientation along the (111) crystal face formed on the side surface of the barrier layer 207; and a metal body layer 209 having preferred orientation along the (111) crystal face formed on the surface of the seed crystal layer 208 and fill the deep hole. The detailed structures and intermediate structures are described above with respect to the fabrication processes.

In certain other embodiments, anther semiconductor structure may be formed by the disclosed methods and processes; and FIG. 10 illustrates a corresponding semiconductor structure. As shown in FIG. 10, the semiconductor structure includes a semiconductor substrate 100 having a through hole (not labeled); and an oxide layer 205 formed on the side surface of the through hole. The semiconductor structure also includes an amorphous silicon layer 206 formed on the side surface of the oxide layer 205; and a barrier layer 207 having a preferred orientation along the (111) crystal face formed on the side surface of the amorphous silicon layer 206. Further, the semiconductor structure includes a seed crystal layer 208 having a preferred orientation along the (111) crystal face formed on the side surface of the barrier layer 207; and a metal body layer 209 having a preferred orientation along the (111) crystal face formed on the surface of the seed crystal layer 208 and fill up the through hole. The top surfaces of the oxide layer 205, the amorphous silicon layer 206, the barrier layer 207, the seed crystal layer 208, and the metal body layer 209 and the bottom surfaces of the oxide layer 205, the amorphous silicon layer 206, the barrier layer 207, the seed crystal layer 208, and the metal body layer 209 may level with the upper surface of the substrate 200 and the bottom surface of the substrate 200, respectively. The detailed structures and intermediate structures are described above with respect to the fabrication processes.

Therefore, according to the disclosed methods and structures, an amorphous silicon layer may be formed before forming a barrier layer, because the amorphous silicon layer may have a significantly large quantity of suspending bonds, when the barrier layer is formed on the surface of the amorphous silicon layer, the suspending bonds may form bonds with the atoms in the nuclei of the barrier. Thus, a significantly large energy may be released. The released energy may participate the growth of the nuclei; and provide an energy base for the nuclei to grow into crystal grains with preferred orientation along a (111) crystal face. Thus, the barrier layer formed on the surface of the amorphous silicon layer may have a preferred orientation along the (111) crystal face; and the metal layer subsequently formed on the surface of the barrier layer may also have a preferred orientation along the (111) crystal face. The crystal grains having the preferred orientation along the (111) crystal face may have a significantly strong anti-electromigration ability. Further, the crystal grains having a preferred orientation along the (111) crystal face may have a lower resistivity than the crystal grains having a preferred orientation along the (200) crystal face. Thus, the resistance of the metal layer formed by the disclosed methods may be reduced; and the anti-electromigration ability may be increased. Therefore, the anti-electromigration ability and the RC delay effect of the semiconductor structure having the metal layer with a preferred orientation along the (111) crystal face may be improved; and the electrical properties of the semiconductor structure may be optimized.

Further, an oxide layer may be formed on the side surface of the deep hole (a portion of a through hole) by a thermal annealing process before forming the amorphous silicon layer. The oxide layer may be used to repair the damages caused by the etching process for forming the through hole. Thus, a desired interface for forming the amorphous silicon layer may be provided. The oxide layer may also be able to increase the adhesion between the amorphous silicon layer and the side surface of the through hole. Thus, the electrical properties of the semiconductor structure may be further improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:

providing a substrate having an upper surface and a bottom surface;

forming a deep hole in the substrate from the upper surface;

forming an amorphous silicon layer on a side surface and a bottom surface of the deep hole to promote a preferred crystal orientation in subsequently formed layers;

forming a barrier layer having a preferred orientation along a (111) crystal face on the amorphous silicon layer;

forming a metal layer having a preferred orientation along the (111) crystal face on the barrier layer to fill the deep hole, wherein after forming the metal layer, further including: grinding the substrate from the bottom surface of the substrate until a bottom surface of the metal layer is exposed.

2. The method according to claim 1, wherein:
the barrier layer is made of TiN, TaN, or Ta.

3. The method according to claim 2, wherein:
the barrier layer is formed by a chemical vapor deposition process.

4. The method according to claim 3, wherein:
the barrier layer is made of TiN;
a reaction gas of the chemical vapor deposition process for forming the barrier layer includes a titanium source gas, a nitrogen source gas and $H_2$;
the titanium source gas is $TiCl_4$;
the nitrogen source gas is $N_2$;
a flow rate of the titanium source gas is in a range of approximately 20 sccm~200 sccm;
a flow rate of the nitrogen source gas is in a range of approximately 20 sccm~200 sccm;
a flow rate of $H_2$ is in a range of approximately 10 sccm~100 sccm;
a pressure of a reaction chamber of the chemical vapor deposition process is in a range of approximately 1 Torr~20 Torr; and
a temperature of the reaction chamber of the chemical vapor deposition process is in a range of approximately 750° C~1000° C.

5. The method according to claim 1, wherein:
a thickness of the barrier layer is in a range of approximately 100 Å~1000 Å.

6. The method according to claim 1, wherein:
the amorphous silicon layer is formed by a chemical vapor deposition process.

7. The method according to claim 1, wherein:
a reaction gas of the chemical vapor deposition process includes a silicon source gas;
the silicon source gas is $SiH_4$;
a flow rate of the silicon source gas is in a range of approximately 20 sccm~50 sccm;
a pressure of a reaction chamber of the chemical vapor deposition process is in a range of approximately 20 Torr~50 Torr; and
a temperature of the reaction chamber is in a range of approximately 400° C~500° C.

8. The method according to claim 1, wherein:
a thickness of the amorphous silicon layer is in a range of approximately 100 Å~500 Å.

9. The method according to claim 1, wherein:
the metal layer includes a seed crystal layer formed on the barrier layer and a metal body layer filling the deep hole formed on the seed crystal layer.

10. The method according to claim 9, wherein:
the metal body layer is made of Cu; and
the metal body layer is formed by an electroplating process.

11. The method according to claim 1, before forming the amorphous silicon layer, further including:
forming an oxide layer on the side surface and the bottom surface of the deep hole.

12. The method according to claim 11, wherein:
the oxide layer is formed by a thermal oxidation process.

13. The method according to claim 1, wherein grinding the substrate until a bottom surface of the metal layer is exposed further includes:
performing a first grinding process until a bottom surface of the oxide layer is exposed;
performing a second grinding process until a bottom surface of the amorphous silicon layer is exposed;
performing a third grinding process until a bottom surface of the barrier layer is exposed;
performing a fourth grinding process until a bottom surface of the seed crystal layer is exposed; and
performing a fifth grinding process until a bottom surface of the metal body layer is exposed.

14. The method according to claim 1, after forming the metal layer, further including:
removing a portion of the amorphous silicon layer, a portion of the barrier layer and a portion of the metal layer higher than the upper surface of the substrate.

15. A semiconductor structure, comprising:
a substrate;
a through hole formed in the substrate;
an amorphous silicon layer formed on a side surface of the through hole to promote a preferred crystal orientation in subsequently formed layers;
a barrier layer having a preferred orientation along a (111) crystal face formed on a side surface of the amorphous silicon layer; and
a metal layer having a preferred orientation along the (111) crystal face formed on the barrier layer to fill the through hole.

16. The semiconductor structure according to claim 15, wherein:
the barrier layer is made of TiN, Ta, or TaN.

17. The semiconductor structure according to claim 15, wherein:
the through hole penetrates through the substrate.

18. The semiconductor structure according to claim 15, wherein:
an oxide layer is formed between the side surface of the through hole and the amorphous silicon layer.

19. The semiconductor device according to claim 15, wherein:
the metal layer include a seed crystal layer and a metal body layer.

* * * * *